(12) United States Patent
Kamo

(10) Patent No.: US 9,977,323 B2
(45) Date of Patent: May 22, 2018

(54) REFLECTIVE MASK AND METHOD FOR MANUFACTURING REFLECTIVE MASK

(71) Applicant: Toshiba Memory Corporation, Tokyo (JP)

(72) Inventor: Takashi Kamo, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 82 days.

(21) Appl. No.: 15/249,970

(22) Filed: Aug. 29, 2016

(65) Prior Publication Data

US 2017/0075209 A1 Mar. 16, 2017

(30) Foreign Application Priority Data

Sep. 14, 2015 (JP) .................................. 2015-181109

(51) Int. Cl.
*G03F 1/24* (2012.01)

(52) U.S. Cl.
CPC ...................... *G03F 1/24* (2013.01)

(58) Field of Classification Search
None
See application file for complete search history.

(56) References Cited

U.S. PATENT DOCUMENTS

2010/0203299 A1 8/2010 Abdallah et al.

FOREIGN PATENT DOCUMENTS

| JP | 4-315416 | 11/1992 |
|---|---|---|
| JP | 6-338444 | 12/1994 |
| JP | 2005-99838 | 4/2005 |
| JP | 2012-49243 | 3/2012 |
| JP | 2014-96483 | 5/2014 |

OTHER PUBLICATIONS

Takai, K., et al., "Capability of etched multilayer EUV mask fabrication", Proc. of SPIE, vol. 9235, pp. 923515-1 to 923515-8 (2014).
Kamo, T., et al., "Mask structure for high NA EUV lithography", 2013 International Symposium on Extreme Ultraviolet Lithography (Toyoma, Japan), pp. 1-17, (2013).

*Primary Examiner* — Stephen Rosasco
(74) *Attorney, Agent, or Firm* — Finnegan, Henderson, Farabow, Garrett & Dunner, L.L.P.

(57) ABSTRACT

A reflective mask comprises a substrate, first and second stacked bodies, and an intermediate portion. The first stacked body is provided on a surface of the substrate. The first stacked body includes a plurality of first layers and a plurality of second layers. A refractive index for a first electromagnetic ray of the first layer is different from a refractive index for the first electromagnetic ray of the second layer. The second stacked body includes a plurality of third layers and a plurality of fourth layers. A refractive index for the first electromagnetic ray of the third layer is different from a refractive index for the first electromagnetic ray of the fourth layer. A reflectance to the first electromagnetic ray of each of the first stacked body and the second stacked body is higher than a reflectance to the first electromagnetic ray of the intermediate portion.

18 Claims, 7 Drawing Sheets

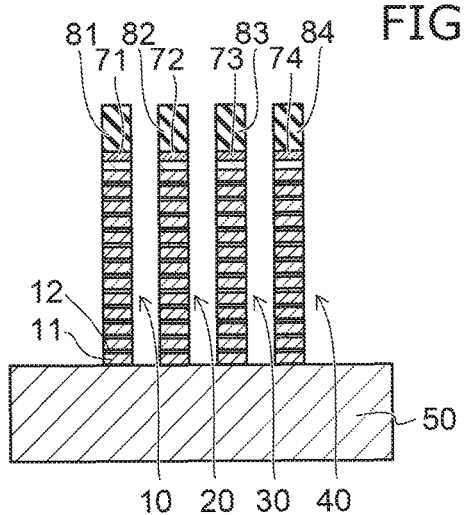
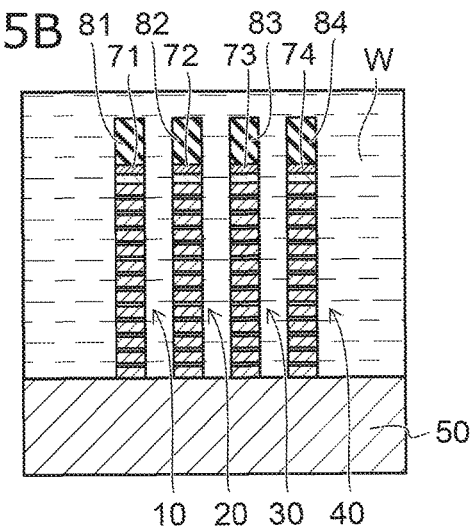
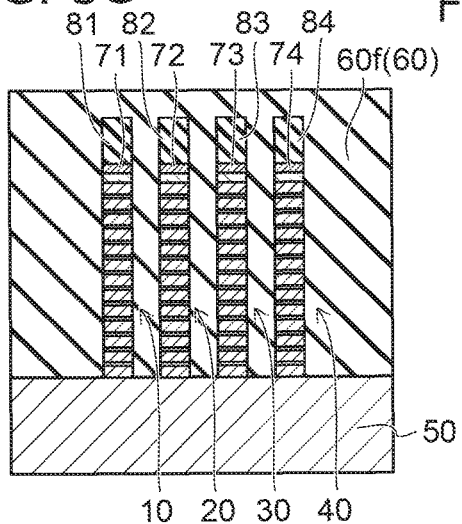
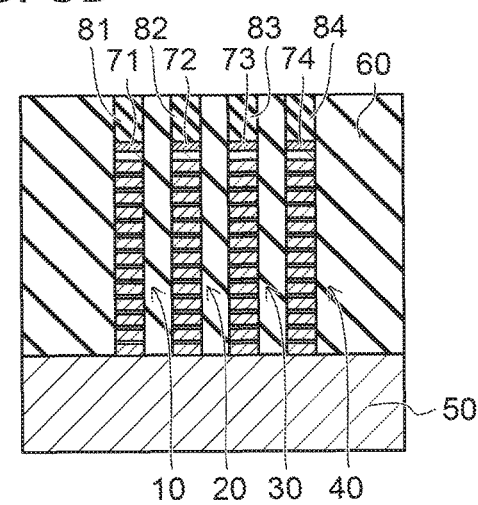
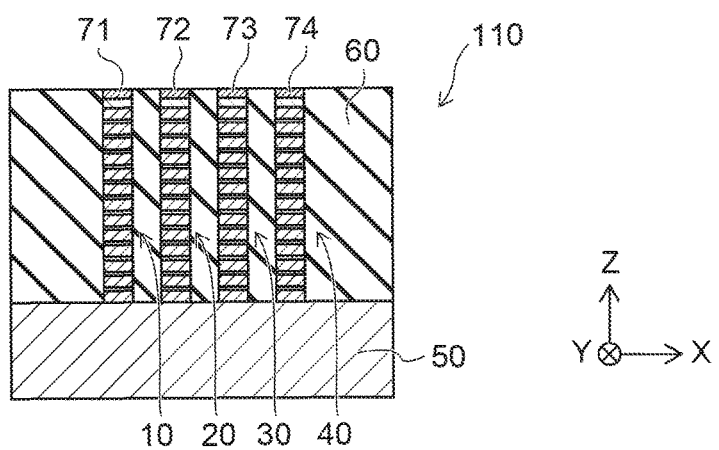

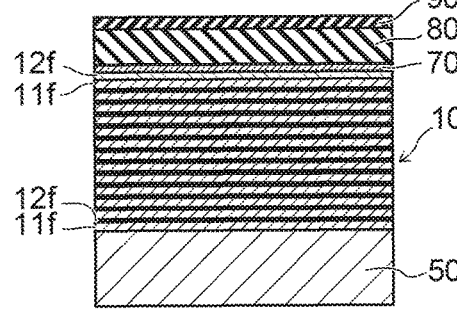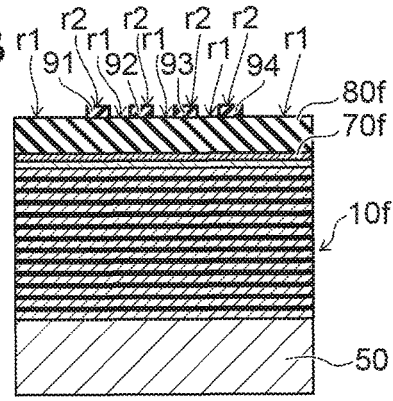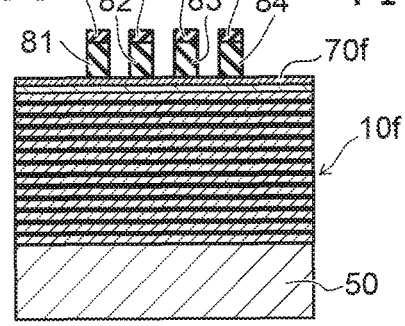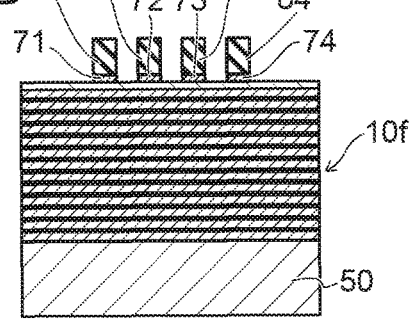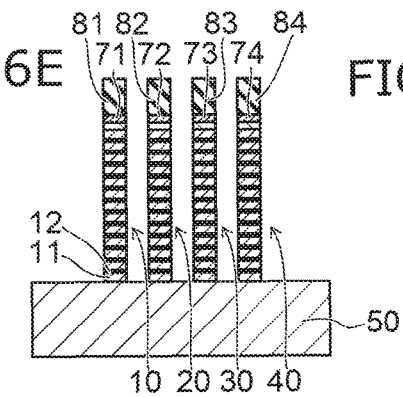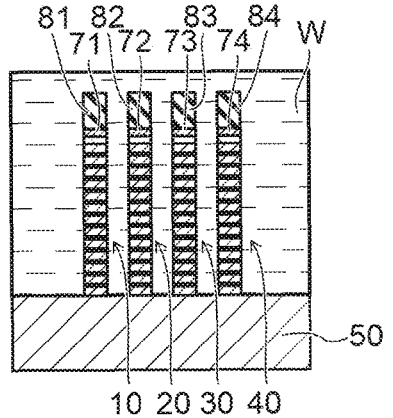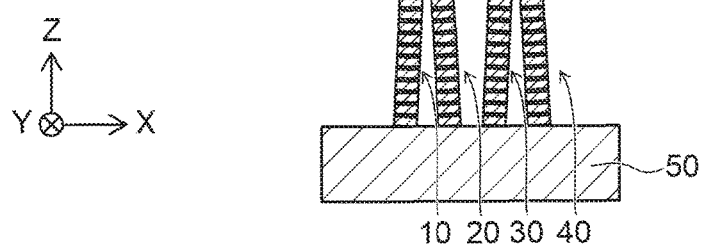

REFLECTIVE MASK AND METHOD FOR MANUFACTURING REFLECTIVE MASK

CROSS-REFERENCE TO RELATED APPLICATIONS

This application is based upon and claims the benefit of priority from Japanese Patent Application No. 2015-181109, filed on Sep. 14, 2015; the entire contents of which are incorporated herein by reference.

FIELD

Embodiments described herein relate generally to a reflective mask and method for manufacturing reflective mask.

BACKGROUND

As the downscaling of semiconductor devices advances, there is an increasing need for downscaling in an EUV lithography process using extra ultraviolet (EUV) light as a light source. A reflective mask in which a light-absorbing pattern is formed is used in the EUV lithography process. In the reflective mask, many reflective layers are used; and a high aspect ratio is realized. It is desirable to improve the quality of such a reflective mask.

BRIEF DESCRIPTION OF THE DRAWINGS

FIG. 5A to FIG. 5E are schematic cross-sectional views in order of the processes, showing a method for manufacturing a reflective mask according to a third embodiment;

FIG. 6A to FIG. 6G are schematic cross-sectional views in order of the processes, showing a method for manufacturing the reflective mask according to the reference example.

DETAILED DESCRIPTION

Figure 1:
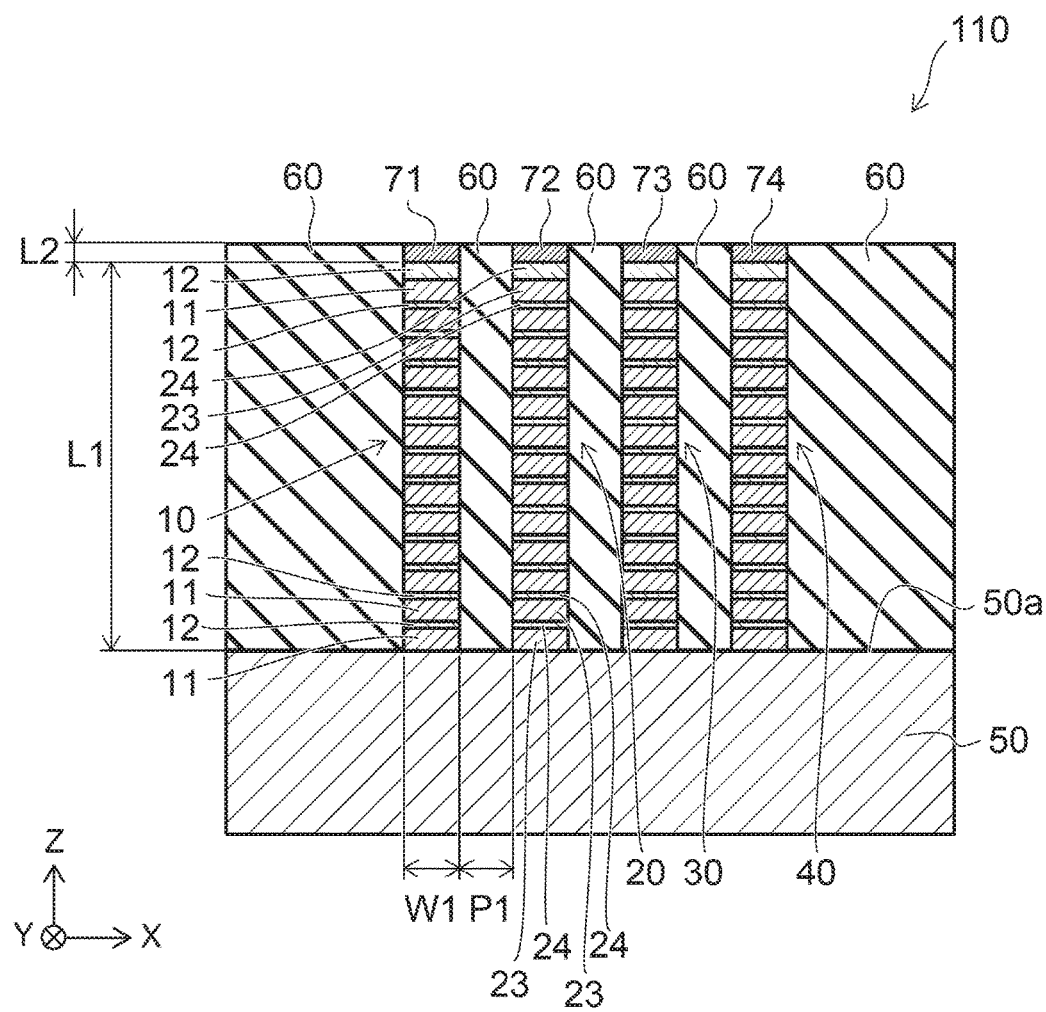
FIG. 1 is a schematic cross-sectional view showing a reflective mask according to a first embodiment.

According to one embodiment, a reflective mask comprises a substrate, a first stacked body, a second stacked body, and an intermediate portion. The first stacked body is provided on a surface of the substrate. The first stacked body includes a plurality of first layers and a plurality of second layers arranged alternately in a first direction. The first direction is perpendicular to the surface. A refractive index for a first electromagnetic ray of the first layer is different from a refractive index for the first electromagnetic ray of the second layer. The second stacked body is provided on the surface. The second stacked body is arranged with the first stacked body in a second direction. The second direction intersects the first direction. The second stacked body includes a plurality of third layers and a plurality of fourth layers arranged alternately in the first direction. A refractive index for the first electromagnetic ray of the third layer is different from a refractive index for the first electromagnetic ray of the fourth layer. The intermediate portion is provided in at least one portion between the first stacked body and the second stacked body. A reflectance to the first electromagnetic ray of the first stacked body is higher than a reflectance to the first electromagnetic ray of the intermediate portion. A reflectance to the first electromagnetic ray of the second stacked body is higher than the reflectance to the first electromagnetic ray of the intermediate portion.

According to another embodiment, a method for manufacturing a reflective mask is provided. The method includes forming a resist pattern by removing one portion of a resist film of a mask blank. The mask blank includes a substrate, a stacked film, a metal film, a hard mask, and a resist film. The stacked film includes a plurality of first films and a plurality of second films stacked alternately on a surface of the substrate. A refractive index for a first electromagnetic ray of the second films is different from a refractive index for the first electromagnetic ray of the first films. The metal film is provided on the stacked film. The hard mask is provided on the metal film. The resist film is provided on the hard mask. The resist pattern includes a region where one portion of the hard mask is exposed and a region covered with a remainder of the resist film. The method includes exposing one portion of the metal film by removing the one portion of the hard mask. The method includes exposing the stacked film by removing the one portion of the metal film, and exposing a remainder of the hard mask by removing the remainder of the resist film. The method includes forming a first stacked body and a second stacked body covered with the remainder of the hard mask by removing at least one portion of the exposed stacked film. The method includes cleaning the first stacked body and the second stacked body using a cleaning liquid. The method includes forming an intermediate portion around each of the first stacked body and the second stacked body by supplying a solution to the cleaning liquid and by curing the solution by baking. The solution includes a component transmitting the first electromagnetic ray. The method includes performing etch-back to planarize the intermediate portion and expose the remainder of the hard mask. The method includes exposing a remainder of the metal film by removing the remainder of the hard mask.

According to another embodiment, a method for manufacturing a reflective mask is provided. The method includes forming a stacked film including a plurality of first films and a plurality of second films stacked alternately on a surface of a substrate. A refractive index for a first electromagnetic ray of the second films is different from a refractive index for the first electromagnetic ray of the first films. The method includes forming a metal film on the stacked film. The method includes forming a hard mask on the metal film. The method includes forming a resist film on the hard mask. The method includes forming a resist pattern by removing one portion of the resist film. The resist pattern includes a region where one portion of the hard mask is exposed and a region covered with a remainder of the resist film. The method includes exposing one portion of the metal film by removing the one portion of the hard mask. The method includes exposing the stacked film by removing the one portion of the metal film, and exposing a remainder of the hard mask by removing the remainder of the resist film. The method includes forming a first stacked body and a second stacked body covered with the remainder of the hard mask by removing at least one portion of the exposed stacked film. The method includes cleaning the first stacked body and the second stacked body using a cleaning liquid. The method includes forming an intermediate portion around each of the first stacked body and the second stacked body by supplying a solution to the cleaning liquid and by curing the solution by baking. The solution includes a component transmitting the first electromagnetic ray. The method includes performing etch-back to planarize the intermediate portion and expose the remainder of the hard mask. The method includes exposing a remainder of the metal film by removing the remainder of the hard mask.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings even in the case where the same portion is illustrated.

In this specification and each drawing, components similar to ones described in reference to an antecedent drawing are marked with the same reference numerals, and a detailed description is omitted as appropriate.

First Embodiment

FIG. 1 is a schematic cross-sectional view showing a reflective mask according to a first embodiment.

The reflective mask 110 according to the embodiment includes a first stacked body 10, a second stacked body 20, a third stacked body 30, a fourth stacked body 40, a substrate 50, and an intermediate portion 60. The number of stacked bodies is not limited to four; and it is sufficient for the number of stacked bodies to be two or more.

The substrate 50 includes a material having a low thermal expansion coefficient. It is desirable for the substrate 50 to have high dimensional stability, smoothness, and flatness and to have excellent resistance to cleaning liquids used to clean the mask. The substrate 50 includes, for example, a low thermal expansion material (LTEM) such as quartz glass, crystallized glass, etc.

The first stacked body 10 is provided on a surface 50a of the substrate 50. The first stacked body 10 includes multiple first layers 11 and multiple second layers 12 arranged alternately in a first direction. Here, a direction perpendicular to the surface 50a is taken as a Z-direction. One direction intersecting the Z-direction is taken as an X-direction. One direction intersecting the Z-direction and the X-direction is taken as a Y-direction. The first direction is, for example, the Z-direction.

The first stacked body 10 includes the multiple first layers 11 and the multiple second layers 12. The first layer 11 and the second layer 12 are stacked alternately. The first layer 11 and the second layer 12 form a pair; and in the example, forty layers of the first layer 11 and forty layers of the second layer 12 are included in forty pairs. The number of pairs is not limited to forty pairs; and it is sufficient for the number of pairs to be twenty pairs or more.

In the example, a height L1 (the length along the Z-direction) of the first stacked body 10 is, for example, not less than 250 nanometers (nm) and not more than 350 nm. A width W1 (the length along the X-direction) of the first stacked body 10 is, for example, not less than 40 nm and not more than 60 nm. A spacing P1 between the first stacked body 10 and the second stacked body 20 is, for example, not less than 40 nm and not more than 60 nm.

The refractive index for a first electromagnetic ray of the first layer 11 is different from the refractive index for the first electromagnetic ray of the second layer 12. The first layer 11 includes, for example, molybdenum (Mo). The second layer 12 includes silicon (Si). In such a case, the refractive index for the first electromagnetic ray of the first layer 11 is lower than the refractive index for the first electromagnetic ray of the second layer 12.

For example, the first electromagnetic ray has a wavelength that is not less than 1 nm and not more than 20 nm. The first electromagnetic ray includes EUV light. EUV light is an electromagnetic ray of a wavelength in the soft X-ray region or the vacuum ultraviolet region. Specifically, EUV light is an electromagnetic ray in a wavelength region that is not less than 10 nm and not more than 20 nm, and in particular, a wavelength region of 13.5±0.5 nm. Hereinbelow, the case is described as an example where EUV light is used as the first electromagnetic ray.

Other than molybdenum/silicon, a multilayer film may have a configuration of ruthenium (Ru)/silicon to obtain a high reflectance to EUV light of a wavelength in the vicinity of 13 nm. Here, n is the refractive index; and k is the extinction coefficient (the imaginary part of the complex refractive index). The extinction coefficient k relates to the level of the absorption of the energy of light inside a substance. The optical constants (n and k) of silicon for a wavelength of 13.5 nm are, for example, $n(Si)=0.9993$, and
$k(Si)=0.0018$.

Conversely, the optical constants (n and k) of molybdenum and ruthenium are, for example, $n(Mo)=0.9211$
$k(Mo)=0.0064$
$n(Ru)=0.8872$, and
$k(Ru)=0.0175$.

Thus, in the case of absorption by the multilayer film itself, to obtain a high reflectance, it is desirable for the difference between the refractive indexes n of the substances included in the multilayer film to be large and for the difference between the absorption (the extinction coefficients k) to be small. It can be seen from the optical constants described above that a ruthenium/silicon multilayer film is suitable to obtain a high reflectance from the perspective of the refractive index n; and a molybdenum/silicon multilayer film is suitable to obtain a high reflectance from the perspective of the absorption (the extinction coefficient k). When these two multilayer films are compared, the effect of the absorption is large. Therefore, for example, for the forty-pair multilayer film, the peak reflectance of the molybdenum/silicon multilayer film is higher than the peak reflectance of the ruthenium/silicon multilayer film. Therefore, the molybdenum/silicon multilayer film is applied.

The second stacked body 20 is provided on the surface 50a of the substrate 50. The second stacked body 20 is arranged with the first stacked body 10 in a second direction. The second direction is, for example, the X-direction. The second stacked body 20 includes multiple third layers 23 and multiple fourth layers 24 that are arranged alternately in the Z-direction. When the first stacked body 10 and the second stacked body 20 are viewed in the XY plane, there may be a portion that links the first layer 11 and the third layer 23; and there may be a portion that links the second layer 12 and the fourth layer 24.

The second stacked body 20 includes the multiple third layers 23 and the multiple fourth layers 24. The third layer 23 and the fourth layer 24 are stacked alternately. The refractive index for EUV light of the third layer 23 is different from the refractive index for EUV light of the fourth layer 24. The third layer 23 includes, for example, molybdenum. The fourth layer 24 includes, for example, silicon. In such a case, the refractive index for EUV light of the third layer 23 is lower than the refractive index for EUV light of the fourth layer 24. The second stacked body 20 has a stacked structure similar to that of the first stacked body 10.

The third stacked body 30 and the fourth stacked body 40 have stacked structures similar to those of the first and second stacked bodies 10 and 20. In other words, a multilayer film of molybdenum and silicon is applied to each of the third stacked body 30 and the fourth stacked body 40.

The intermediate portion 60 is provided between the first stacked body 10 and the second stacked body 20, between the second stacked body 20 and the third stacked body 30, and between the third stacked body 30 and the fourth stacked body 40. The intermediate portion 60 is provided also on the side of the first stacked body 10 opposite to the second stacked body 20. The intermediate portion 60 is provided also on the side of the fourth stacked body 40 opposite to the third stacked body 30. The intermediate portion 60 includes, for example, silicon oxide.

The reflectance to EUV light of the first stacked body 10 is higher than the reflectance to EUV light of the intermediate portion 60. Similarly, the reflectance to EUV light of the second stacked body 20 is higher than the reflectance to EUV light of the intermediate portion 60. The reflectance to EUV light of the third stacked body 30 is higher than the reflectance to EUV light of the intermediate portion 60. The reflectance to EUV light of the fourth stacked body 40 is higher than the reflectance to EUV light of the intermediate portion 60. The absorption of EUV light by the first to fourth stacked bodies 10 to 40 is small. The first to fourth stacked bodies 10 to 40 function as reflective layers of EUV light.

In the case where the first stacked body 10 includes forty pairs of molybdenum and silicon, the reflectance to EUV light of the first stacked body 10 is, for example, not less than 60% and not more than 80%. The reflectance to EUV light is similar to that of the first stacked body 10 for each of the second to fourth stacked bodies 20 to 40.

The transmittance for EUV light of the intermediate portion 60 is higher than the transmittance for EUV light of the first stacked body 10. Similarly, the transmittance for EUV light of the intermediate portion 60 is higher than the transmittance for EUV light of the second stacked body 20. The transmittance for EUV light of the intermediate portion 60 is higher than the transmittance for EUV light of the third stacked body 30. The transmittance for EUV light of the intermediate portion 60 is higher than the transmittance for EUV light of the fourth stacked body 40. The intermediate portion 60 substantially does not reflect EUV light. The intermediate portion 60 functions as a transmissive layer of EUV light.

For the intermediate portion 60, the proportion of EUV light that is transmitted is high; and the proportion of EUV light that is reflected and the proportion of EUV light that is absorbed are relatively low. In the case where the intermediate portion 60 includes silicon oxide (e.g., $SiO_2$), the absorptance for EUV light of the intermediate portion 60 is, for example, 1% or less.

A first metal layer 71 is provided on the first stacked body 10. The first metal layer 71 includes, for example, ruthenium (Ru). In the example, a length L2 along the Z-direction of the first metal layer 71 is not less than 2.0 nm and not more than 3.0 nm. The first metal layer 71 functions as a protective layer that protects the first stacked body 10. A second metal layer 72 is provided on the second stacked body 20. The second metal layer 72 includes, for example, ruthenium. The second metal layer 72 functions as a protective layer that protects the second stacked body 20.

Similarly, a third metal layer 73 is provided on the third stacked body 30. The third metal layer 73 includes, for example, ruthenium. A fourth metal layer 74 is provided on the fourth stacked body 40. The fourth metal layer 74 includes, for example, ruthenium.

The molybdenum that is included in the materials of the first to fourth stacked bodies 10 to 40 oxidizes easily in ambient air; and there is a possibility that the reflectance to EUV light of the first to fourth stacked bodies 10 to 40 may decrease. Therefore, it is desirable to provide a protective layer including ruthenium on each of the first to fourth stacked bodies 10 to 40. Thereby, the oxidization of the molybdenum can be suppressed. The EUV light that is incident on the reflective mask 110 is reflected by the first to fourth stacked bodies 10 to 40 and is transmitted by the intermediate portion 60. The reflective mask 110 has a multilayer film dug out mask structure. That is, the reflective mask 110 includes a reflection region that includes the first to fourth stacked bodies 10 to 40, and a transmission region that includes the intermediate portion 60. The intermediate portion 60 is formed in the portion where the multilayer film including molybdenum and silicon is dug out. Compared to a light-absorbing mask structure, the multilayer film dug out mask structure is desirable in that the three-dimensional effect of the mask typified by the dimensional difference of the vertical line/horizontal line transfer patterns at 0.33 NA (Numerical Aperture) can be reduced; and the NA can be increased while the mask magnification is maintained at 4 times. The light-absorbing mask structure is a structure in which a light-absorbing layer including a tantalum compound or the like is provided on the multilayer film including molybdenum and silicon.

Here, NA is the numerical aperture of the projection optical system. In the lithography process, it is possible to image a fine pattern using a short wavelength and a large NA. By employing the multilayer film dug out mask structure, it is possible to realize NA>0.5 while a mask magnification of 4 times and a full-field exposure are maintained.

A reduced transfer pattern is formed on a wafer (not shown) by EUV light reflected by such a reflective mask 110.

Figure 2A:
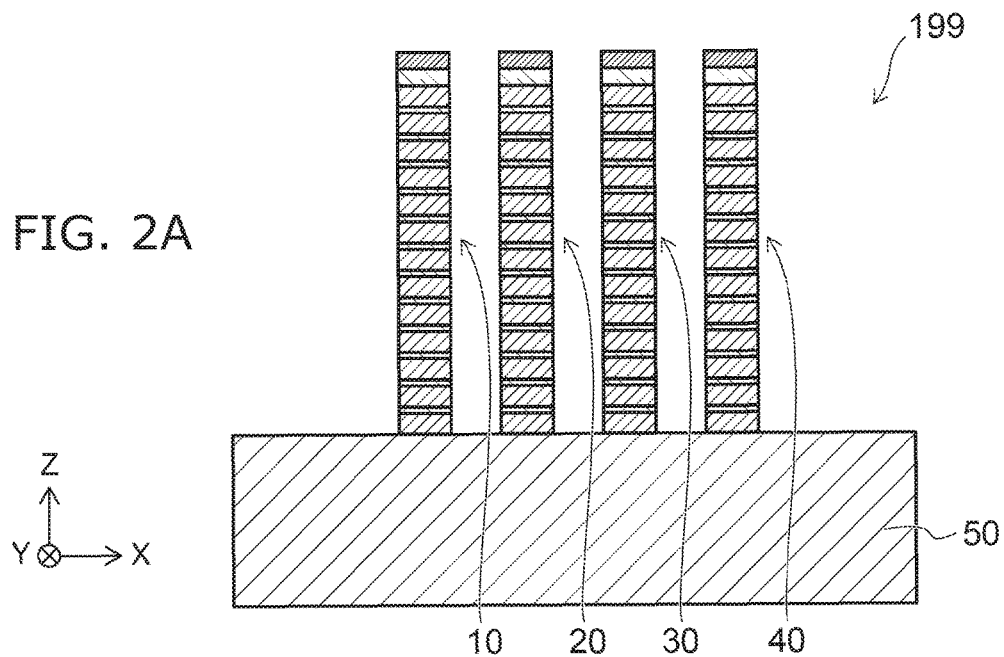
FIG. 2A and FIG. 2B are schematic cross-sectional views showing a reflective mask according to a reference example.
Figure 2B:
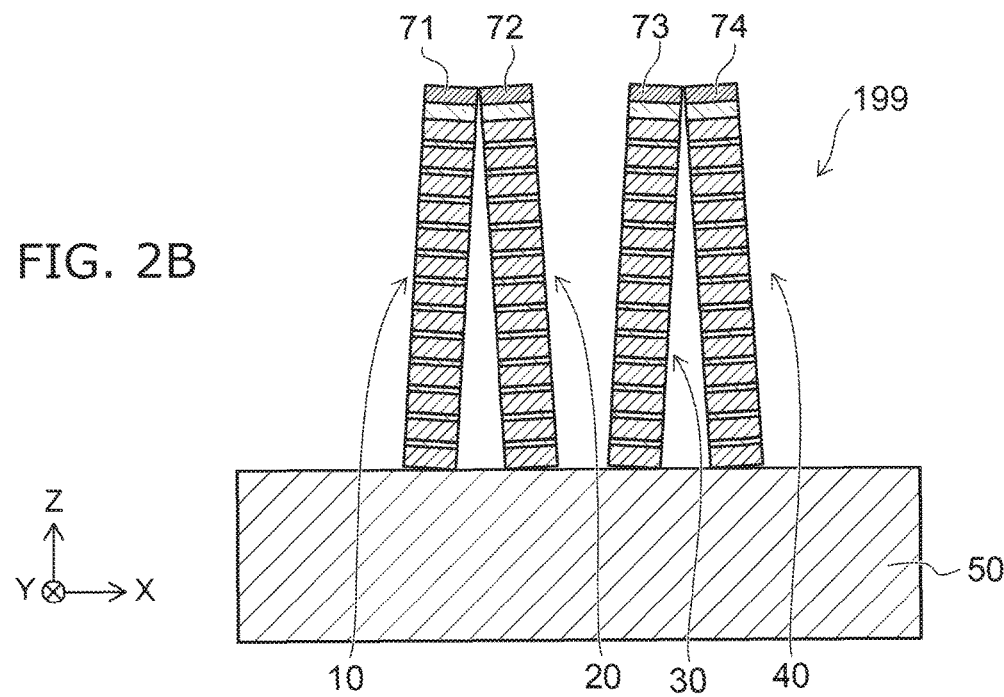

FIG. 2A and FIG. 2B are schematic cross-sectional views showing a reflective mask according to a reference example.

As shown in FIG. 2A, a reflective mask 199 according to the reference example realizes a high aspect ratio by increasing the number of reflective layers. In the reflective mask 199, the first to fourth stacked bodies 10 to 40 are formed as reflective layers on the substrate 50 by performing fine patterning. Each of the first to fourth stacked bodies 10 to 40 extends to be short in the X-direction and long in the Z-direction. In the reference example, the intermediate portion 60 does not exist between the first stacked body 10 and the second stacked body 20, between the second stacked body 20 and the third stacked body 30, and between the third stacked body 30 and the fourth stacked body 40.

In such a case, as shown in FIG. 2B, there is a possibility that the first to fourth stacked bodies 10 to 40 may collapse. For example, such a collapse of the stacked bodies may occur in the drying process after the patterning of the dug out pattern and the cleaning. Specifically, it is considered that the surface tension of the cleaning liquid (e.g., the rinse chemical liquid, purified water, etc.) that remains between the stacked bodies in the drying process is a cause. The surface tension of the cleaning liquid changes according to the temperature. Therefore, the surface tension of the cleaning liquid remaining between the stacked bodies changes according to the change of the temperature in the drying process. Thereby, stress is applied between the stacked bodies; and the stacked bodies collapse. The collapse of the stacked bodies is a defect of the reflective mask that causes the quality of the mask to decrease.

Conversely, according to the embodiment, the intermediate portion 60 is provided between the first stacked body 10 and the second stacked body 20, between the second stacked body 20 and the third stacked body 30, and between the third stacked body 30 and the fourth stacked body 40. Thereby, the occurrence of the collapse of the first to fourth stacked bodies 10 to 40 can be suppressed. Thereby, the occurrence of defects of the reflective mask can be suppressed; and a high-quality reflective mask can be provided.

Second Embodiment

Figure 3:
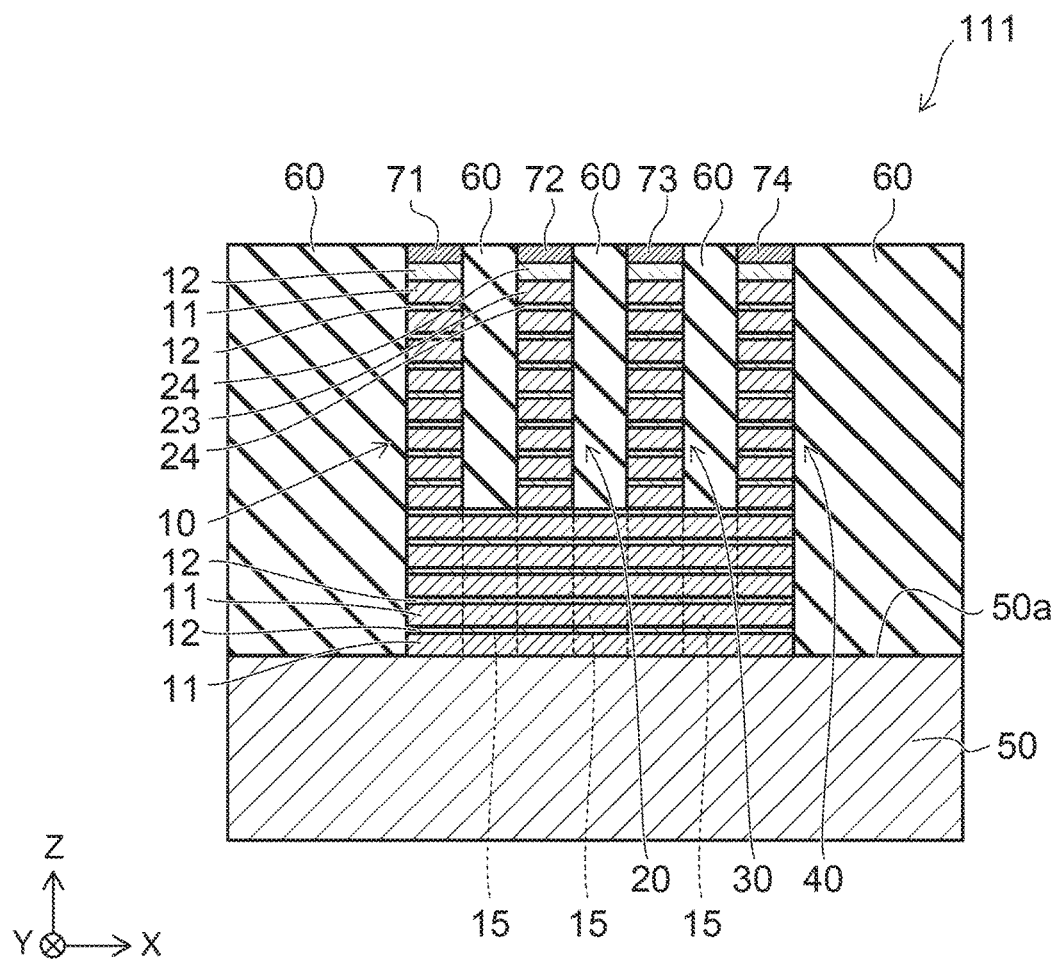
FIG. 3 is a schematic cross-sectional view showing a reflective mask according to a second embodiment.

FIG. 3 is a schematic cross-sectional view showing a reflective mask according to a second embodiment.

The reflective mask 111 according to the embodiment includes the first to fourth stacked bodies 10 to 40, the substrate 50, and the intermediate portion 60 and further includes an intermediate stacked body 15. The intermediate stacked body 15 is provided on the substrate 50. The intermediate stacked body 15 is provided in a lower portion between the first stacked body 10 and the second stacked body 20, a lower portion between the second stacked body 20 and the third stacked body 30, and a lower portion between the third stacked body 30 and the fourth stacked body 40.

Similarly to the first stacked body 10, the intermediate stacked body 15 includes the multiple first layers 11 and the multiple second layers 12. The first layer 11 and the second layer 12 are stacked alternately in the intermediate stacked body 15. The first layer 11 includes, for example, molybdenum. The second layer 12 includes silicon. In other words, the lower portions of the first to fourth stacked bodies 10 to 40 are linked via the intermediate stacked body 15. Similarly to the first to fourth stacked bodies 10 to 40, the intermediate stacked body 15 functions as reflective layers of EUV light.

The intermediate portion 60 is provided on the intermediate stacked body 15. The intermediate portion 60 is provided in an upper portion between the first stacked body 10 and the second stacked body 20, an upper portion between the second stacked body 20 and the third stacked body 30, and an upper portion between the third stacked body 30 and the fourth stacked body 40.

Between the first stacked body 10 and the second stacked body 20, the intermediate stacked body 15 is provided on the lower portion side; and the intermediate portion 60 is provided on the upper portion side. That is, in addition to the first stacked body 10 and the second stacked body 20, the lower portion between the first stacked body 10 and the second stacked body 20 also includes reflective layers. The upper portion between the first stacked body 10 and the second stacked body 20 is a transmissive layer. This is similar for the regions between the second stacked body 20 and the third stacked body 30 and between the third stacked body 30 and the fourth stacked body 40 as well.

Thus, according to the embodiment, by providing the intermediate portion 60 in one portion between the stacked bodies, it is possible to appropriately adjust the intensity of the reflection of the EUV light according to the resist pattern while suppressing the collapse of the first to fourth stacked bodies 10 to 40.

Third Embodiment

FIG. 4A to FIG. 4D and FIG. 5A to FIG. 5E are schematic cross-sectional views in order of the processes, showing a method for manufacturing a reflective mask according to a third embodiment.

Figure 4A:
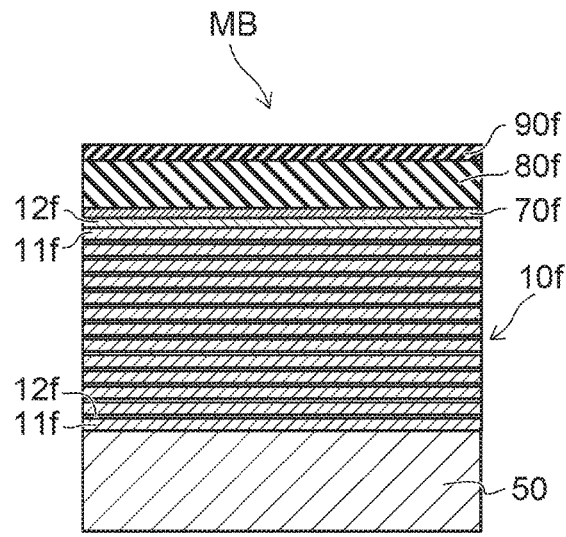
FIG. 4A to FIG. 4D are schematic cross-sectional views in order of the processes, showing a method for manufacturing a reflective mask according to a third embodiment.

As shown in FIG. 4A, a stacked film 10f is formed by stacking multiple first films 11f and multiple second films 12f alternately on a surface of the substrate 50. The refractive index for EUV light of the second film 12f is different from the refractive index for EUV light of the first film 11f.

The material of the substrate 50 includes, for example, a low thermal expansion material (LTEM) such as quartz glass, crystallized glass, etc. For example, the stacked film 10f is formed of a multilayer film having a high reflectance to EUV light. The first film 11f includes, for example, molybdenum. The second film 12f includes, for example, silicon. In such a case, the refractive index for EUV light of the first film 11f is lower than the refractive index for EUV light of the second film 12f.

For example, a molybdenum film and a silicon film are stacked alternately in the stacked film 10f. Twenty pairs or more of the molybdenum film and the silicon film are stacked. In the example, forty pairs are stacked. For example, the stacked film 10f is formed using sputtering.

A metal film 70f is formed on the stacked film 10f as a protective film of the stacked film 10f. The metal film 70f includes, for example, ruthenium. Here, it is desirable for the uppermost layer of the stacked film 10f to be highly reflective molybdenum to increase the reflectance of the stacked film 10f. However, molybdenum oxidizes easily in ambient air. Therefore, it is desirable to form the metal film 70f having ruthenium as a major component from the perspective of oxidation suppression, protection when cleaning the mask, etc. For example, the metal film 70f is formed using sputtering.

A hard mask 80f is formed on the metal film 70f. The hard mask 80f is formed of an inorganic material that can be etched selectively with respect to the stacked film 10f and the metal film 70f. The material of the hard mask 80f includes, for example, TaN (tungsten nitride), CrN (chromium nitride), etc. For example, the hard mask 80f is formed using sputtering.

A resist film 90f is formed on the hard mask 80f. For example, a highly-sensitive chemically amplified positive resist is used as the resist film 90f. For example, the resist film 90f is formed using sputtering. Thus, a mask blank MB is formed.

Here, the mask blank MB may be pre-prepared. In such a case, the process of forming the mask blank MB is unnecessary. The mask blank MB includes the substrate 50, the stacked film 10f, the metal film 70f, the hard mask 80f, and the resist film 90f. The stacked film 10f includes the multiple first films 11f and the multiple second films 12f stacked alternately on the surface of the substrate 50. The refractive index for EUV light of the second film 12f is different from the refractive index for EUV light of the first film 11f. The metal film 70f is provided on the stacked film 10f. The hard mask 80f is provided on the metal film 70f. The resist film 90f is provided on the hard mask 80f.

Figure 4B:
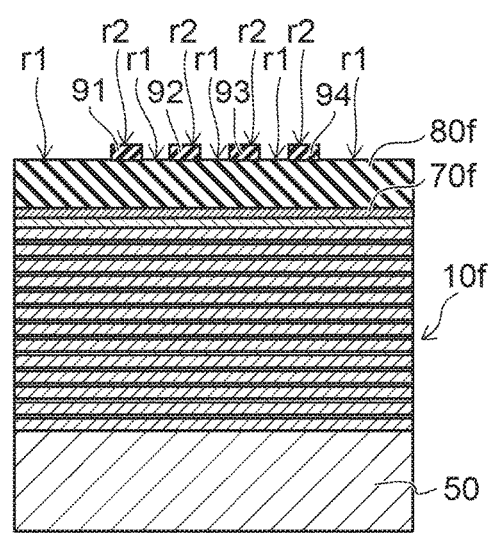

As shown in FIG. 4B, a resist pattern that includes a region r1 where one portion of the hard mask 80f is exposed and a region r2 covered with the remainder of the resist film

90f is formed by removing one portion of the resist film 90f of the mask blank MB. Thereby, the remainder of the resist film 90f is formed in the region r2. The remainder of the resist film 90f is first to fourth resist films 91 to 94. In this process, a prescribed resist pattern is written on the mask blank MB using an electron beam (EB); and the processing of post exposure bake (PEB), development, etc., are implemented. Thereby, a resist mask that includes the prescribed resist pattern is formed.

Figure 4C:
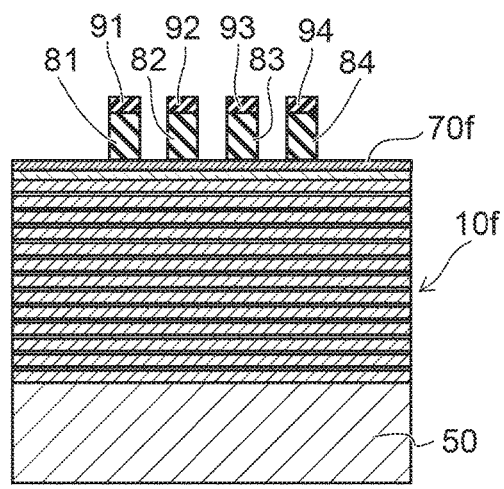

As shown in FIG. 4C, one portion of the metal film 70f is exposed by removing one portion of the hard mask 80f. The removed portion of the hard mask 80f corresponds to the region r1. For example, dry etching is used to remove the one portion of the hard mask 80f. Thereby, a remainder of the hard mask 80f is formed. The remainder of the hard mask 80f is first to fourth hard masks 81 to 84.

Figure 4D:
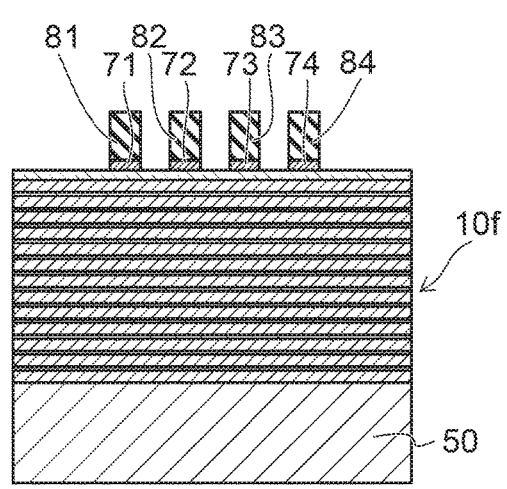

As shown in FIG. 4D, one portion of the stacked film 10f is exposed by removing one portion of the exposed metal film 70f. The removed portion of the metal film 70f corresponds to the region r1. The remainder of the hard mask 80f (the first to fourth hard masks 81 to 84) is exposed by removing the remainder of the resist film 90f (the first to fourth resist films 91 to 94). For example, dry etching is used to remove the one portion of the metal film 70f and the remainder of the resist film 90f. Thereby, the first to fourth metal layers 71 to 74 are formed. Either the removal of the one portion of the metal film 70f or the removal of the remainder of the resist film 90f may be performed first.

As shown in FIG. 5A, the first stacked body 10, the second stacked body 20, the third stacked body 30, and the fourth stacked body 40 that are covered with the remainder of the hard mask 80f (the first to fourth hard masks 81 to 84) are formed by removing one portion of the exposed stacked film 10f. The first stacked body 10 includes the multiple first layers 11 and the multiple second layers 12 arranged alternately in the Z-direction. The first layer 11 and the second layer 12 are stacked alternately in the first stacked body 10. The second to fourth stacked bodies 20 to 40 have stacked structures similar to that of the first stacked body 10. The removed portion of the stacked film 10f corresponds to the region r1. For example, dry etching is used to remove the one portion of the stacked film 10f.

As shown in FIG. 5B, the first to fourth stacked bodies 10 to 40 are cleaned (rinsed) using a cleaning liquid W. The cleaning liquid W includes, for example, a rinse chemical liquid, purified water, etc. For example, the specific resistance (the electrical resistivity) or the electrical conductivity can be used as an index of the purity of water. The specific resistance of purified water is, for example, not less than 0.1 megohm·centimeter (MΩ·cm) and not more than 15 MΩ·cm. The theoretical specific resistance of purified water is about 18.2 megohm·centimeter (MΩ·cm) at 25° C. Water that infinitesimally approaches the theoretical specific resistance is called ultra pure water. Ultra pure water may be used as the cleaning liquid W.

As shown in FIG. 5C, a solution 60f that includes a material transmitting EUV light is supplied around each of the first to fourth stacked bodies 10 to 40 in a state in which one portion of the cleaning liquid W remains. The solution 60f is supplied between the first stacked body 10 and the second stacked body 20, between the second stacked body 20 and the third stacked body 30, between the third stacked body 30 and the fourth stacked body 40, and on the remainder of the hard mask 80f (the first to fourth hard masks 81 to 84). Then, the intermediate portion 60 is formed by curing the solution 60f by baking. The material that transmits EUV light is, for example, silicon. The intermediate portion 60 includes, for example, silicon oxide.

The drying process is not implemented in the embodiment. The portion that is filled with the cleaning liquid W (referring to FIG. 5B) is replaced with the solution 60f. The solution 60f is a coating liquid in which a polymer including silicon is diluted with an organic solvent. For example, dibutyl ether is used as the organic solvent. For example, polysilazane is used as the polymer. Polysilazane has —(SiH$_2$NH)— as a basic structure. Polysilazane is an inorganic polymer that includes silicon and is soluble in an organic solvent. The formal name of polysilazane is perhydropolysilazane (PHPS). The organic solvent solution of polysilazane is used as the coating liquid; and baking is implemented. Thereby, the coating liquid reacts with the moisture of the cleaning liquid W remaining after the cleaning process; and a silica (amorphous SiO$_2$) film is obtained. The following chemical formula 1 shows the reaction of changing polysilazane to the SiO$_2$ film.

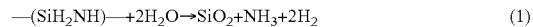

$$—(SiH_2NH)—+2H_2O \rightarrow SiO_2+NH_3+2H_2 \qquad (1)$$

The SiO$_2$ film is formed when the solution 60f including polysilazane reacts with the moisture of the cleaning liquid W remaining after the cleaning process. Specifically, the portion that is filled with the cleaning liquid W is replaced with the solution 60f; spin drying is implemented; and baking using a hotplate is implemented to volatilize the organic solvent. For example, the baking is implemented using the conditions of 140° C. in a vacuum for 12 hours. Thereby, the organic solvent is removed; the solution 60f is cured; and the SiO$_2$ film is formed. In the example, the SiO$_2$ film is used to form the intermediate portion 60.

As shown in FIG. 5D, etch-back is performed to planarize the intermediate portion 60 and expose the remainder of the hard mask 80f (the first to fourth hard masks 81 to 84).

As shown in FIG. 5E, the remainder of the metal film 70f (the first to fourth metal layers 71 to 74) is exposed by removing the remainder of the hard mask 80f (the first to fourth hard masks 81 to 84). For example, dry etching is used to remove the remainder of the hard mask 80f (the first to fourth hard masks 81 to 84).

Thus, the reflective mask 110 can be obtained. In the embodiment, a multilayer film that includes forty pairs of molybdenum/silicon is described as an example. The number of pairs of the multilayer film is not particularly limited and may be twenty pairs or more.

FIG. 6A to FIG. 6G are schematic cross-sectional views in order of the processes, showing a method for manufacturing the reflective mask according to the reference example.

The processes shown in FIG. 6A to FIG. 6F are the same as the processes described in reference to FIG. 4A to FIG. 4D, FIG. 5A, and FIG. 5B of the embodiment. Here, repetitious descriptions are omitted.

In the reference example as shown in FIG. 6G, a drying process is implemented after the cleaning process of FIG. 6F. At this time, collapse of the stacked bodies may occur due to the effects of the surface tension of the cleaning liquid W remaining between the stacked bodies.

Conversely, the drying process is not implemented in the embodiment. The solution 60f that includes the material transmitting EUV light is supplied around each of the first to fourth stacked bodies 10 to 40 in a state in which one portion of the cleaning liquid W remains after the cleaning process. The solution 60f is supplied to the regions between the first stacked body 10 and the second stacked body 20, between the second stacked body 20 and the third stacked body 30, and between the third stacked body 30 and the fourth stacked body 40. Then, the intermediate portion 60 is formed by curing the solution 60f by performing baking.

Thereby, the occurrence of the collapse of the first to fourth stacked bodies 10 to 40 can be suppressed. Thereby, the yield can be increased. Thereby, the occurrence of defects of the reflective mask can be suppressed; and a high-quality reflective mask can be provided.

Fourth Embodiment

Figure 7:
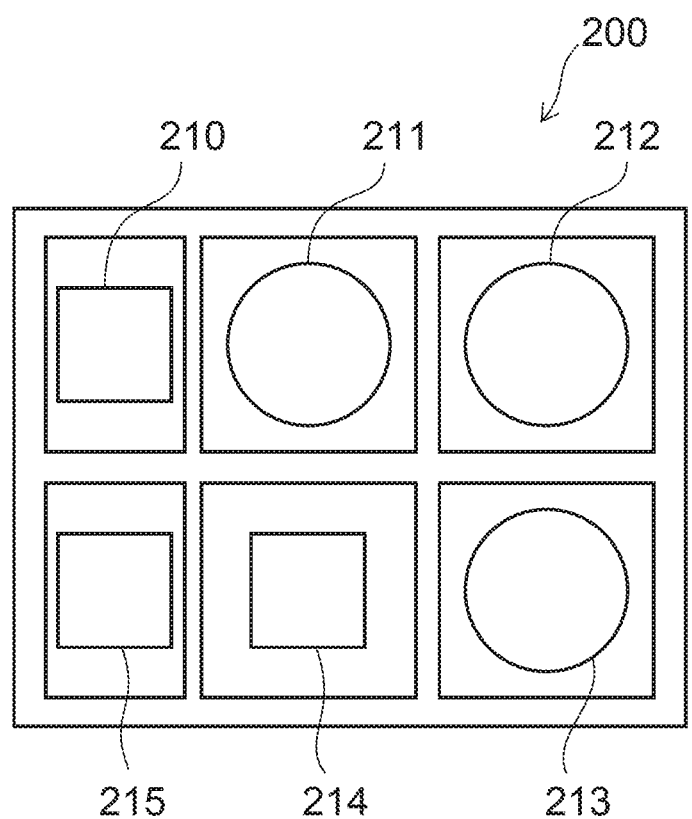
FIG. 7 is a schematic view showing a manufacturing apparatus of the reflective mask according to a fourth embodiment.

FIG. 7 is a schematic view showing a manufacturing apparatus of the reflective mask according to a fourth embodiment.

The manufacturing apparatus 200 according to the embodiment includes a load port 210, a first cleaning chamber 211, a second cleaning chamber 212, a replacement chamber 213, a baking chamber 214, and an unload chamber 215.

The mask stacked body shown in FIG. 5A is supplied to the load port 210. The mask stacked body is transferred from the load port 210 into the first cleaning chamber 211. Rough cleaning using the cleaning liquid W is implemented in the first cleaning chamber 211.

The mask stacked body after the rough cleaning is transferred from the first cleaning chamber 211 into the second cleaning chamber 212. Fine cleaning using the cleaning liquid W is implemented in the second cleaning chamber 212. The cleaning sequence of the rough cleaning and the cleaning sequence of the fine cleaning are substantially the same. By separating the second cleaning chamber 212 for the fine cleaning from the first cleaning chamber 211 for the rough cleaning, it is possible to reduce the mixing of foreign matter into the second cleaning chamber 212 for the fine cleaning. Therefore, the cleanliness of the fine cleaning can be increased.

The mask stacked body after the fine cleaning is transferred from the second cleaning chamber 212 into the replacement chamber 213. In the replacement chamber 213, the solution 60f is coated between the first stacked body 10 and the second stacked body 20, between the second stacked body 20 and the third stacked body 30, and between the third stacked body 30 and the fourth stacked body 40 in a state in which one portion of the cleaning liquid W remains; and spin drying is implemented.

After the spin drying, the mask stacked body is transferred from the replacement chamber 213 into the baking chamber 214. In the baking chamber 214, for example, baking is implemented using the conditions of 140° C. in a vacuum for 12 hours. Thereby, the organic solvent that is included in the solution 60f is removed; the solution 60f is cured; and the intermediate portion 60 is formed. Thus, the reflective mask 110 is obtained.

The completed reflective mask 110 is transferred from the baking chamber 214 into the unload chamber 215. Thus, the reflective mask 110 can be manufactured.

According to the embodiments, a high-quality reflective mask and a method for manufacturing the reflective mask can be provided.

Hereinabove, embodiments of the invention are described with reference to specific examples. However, the invention is not limited to these specific examples. For example, one skilled in the art may similarly practice the invention by appropriately selecting specific configurations of components such as the first stacked body, the second stacked body and the intermediate portion, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all reflective masks and methods for manufacturing a reflective mask practicable by an appropriate design modification by one skilled in the art based on the reflective mask and the method for manufacturing a reflective mask described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A reflective mask, comprising:
    a substrate;
    a first stacked body provided on a surface of the substrate, the first stacked body including a plurality of first layers and a plurality of second layers arranged alternately in a first direction, the first direction being perpendicular to the surface, a refractive index for a first electromagnetic ray of the first layer being different from a refractive index for the first electromagnetic ray of the second layer;
    a second stacked body provided on the surface and arranged with the first stacked body in a second direction, the second direction intersecting the first direction, the second stacked body including a plurality of third layers and a plurality of fourth layers arranged alternately in the first direction, a refractive index for the first electromagnetic ray of the third layer being different from a refractive index for the first electromagnetic ray of the fourth layer; and
    an intermediate portion provided in at least one portion between the first stacked body and the second stacked body,
    a reflectance to the first electromagnetic ray of the first stacked body being higher than a reflectance to the first electromagnetic ray of the intermediate portion,
    a reflectance to the first electromagnetic ray of the second stacked body being higher than the reflectance to the first electromagnetic ray of the intermediate portion.

2. The reflective mask according to claim 1, wherein a wavelength of the first electromagnetic ray is not less than 1 nanometer and not more than 20 nanometers.

3. The reflective mask according to claim 1, wherein a transmittance for the first electromagnetic ray of the intermediate portion is higher than a transmittance for the first electromagnetic ray of the first stacked body and a transmittance for the first electromagnetic ray of the second stacked body.

4. The reflective mask according to claim 1, wherein
the first layer includes molybdenum,
the second layer includes silicon,
the third layer includes molybdenum, and
the fourth layer includes silicon.

5. The reflective mask according to claim 1, wherein the intermediate portion includes silicon oxide.

6. The reflective mask according to claim 1, further comprising:
a first metal layer provided on the first stacked body, the first metal layer including ruthenium; and
a second metal layer provided on the second stacked body, the second metal layer including ruthenium.

7. A method for manufacturing a reflective mask, comprising:
forming a resist pattern by removing one portion of a resist film of a mask blank,
the mask blank including
a substrate,
a stacked film including a plurality of first films and a plurality of second films stacked alternately on a surface of the substrate, a refractive index for a first electromagnetic ray of the second films being different from a refractive index for the first electromagnetic ray of the first films,
a metal film provided on the stacked film,
a hard mask provided on the metal film, and
a resist film provided on the hard mask,
the resist pattern including a region where one portion of the hard mask is exposed and a region covered with a remainder of the resist film;
exposing one portion of the metal film by removing the one portion of the hard mask;
exposing the stacked film by removing the one portion of the metal film, and exposing a remainder of the hard mask by removing the remainder of the resist film;
forming a first stacked body and a second stacked body covered with the remainder of the hard mask by removing at least one portion of the exposed stacked film;
cleaning the first stacked body and the second stacked body using a cleaning liquid;
forming an intermediate portion around each of the first stacked body and the second stacked body by supplying a solution to the cleaning liquid and by curing the solution by baking, the solution including a component transmitting the first electromagnetic ray;
performing etch-back to planarize the intermediate portion and expose the remainder of the hard mask; and
exposing a remainder of the metal film by removing the remainder of the hard mask.

8. The method according to claim 7, wherein a wavelength of the first electromagnetic ray is not less than 1 nanometer and not more than 20 nanometers.

9. The method according to claim 7, wherein the baking is implemented in a vacuum.

10. The method according to claim 7, wherein
the first film includes molybdenum; and
the second film includes silicon.

11. The method according to claim 7, wherein the intermediate portion includes silicon oxide.

12. The method according to claim 7, wherein the metal film includes ruthenium.

13. A method for manufacturing a reflective mask, comprising:
forming a stacked film including a plurality of first films and a plurality of second films stacked alternately on a surface of a substrate, a refractive index for a first electromagnetic ray of the second films being different from a refractive index for the first electromagnetic ray of the first films;
forming a metal film on the stacked film;
forming a hard mask on the metal film;
forming a resist film on the hard mask;
forming a resist pattern by removing one portion of the resist film, the resist pattern including a region where one portion of the hard mask is exposed and a region covered with a remainder of the resist film;
exposing one portion of the metal film by removing the one portion of the hard mask;
exposing the stacked film by removing the one portion of the metal film, and exposing a remainder of the hard mask by removing the remainder of the resist film;
forming a first stacked body and a second stacked body covered with the remainder of the hard mask by removing at least one portion of the exposed stacked film;
cleaning the first stacked body and the second stacked body using a cleaning liquid;
forming an intermediate portion around each of the first stacked body and the second stacked body by supplying a solution to the cleaning liquid and by curing the solution by baking, the solution including a component transmitting the first electromagnetic ray;
performing etch-back to planarize the intermediate portion and expose the remainder of the hard mask; and
exposing a remainder of the metal film by removing the remainder of the hard mask.

14. The method according to claim 13, wherein a wavelength of the first electromagnetic ray is not less than 1 nanometer and not more than 20 nanometers.

15. The method according to claim 13, wherein the baking is implemented in a vacuum.

16. The method according to claim 13, wherein
the first film includes molybdenum; and
the second film includes silicon.

17. The method according to claim 13, wherein the intermediate portion includes silicon oxide.

18. The method according to claim 13, wherein the metal film includes ruthenium.

* * * * *